United States Patent
Kim et al.

(10) Patent No.: US 11,626,836 B2
(45) Date of Patent: Apr. 11, 2023

(54) ENERGY HARVESTER

(71) Applicant: Korea University Research and Business Foundation, Seoul (KR)

(72) Inventors: Yong Sin Kim, Seoul (KR); Yun Chan Im, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 17/586,036

(22) Filed: Jan. 27, 2022

(65) Prior Publication Data

US 2022/0239252 A1 Jul. 28, 2022

(30) Foreign Application Priority Data

Jan. 27, 2021 (KR) .................. 10-2021-0011770
May 12, 2021 (KR) .................. 10-2021-0061623

(51) Int. Cl.
*H02S 40/38* (2014.01)
*H03K 3/037* (2006.01)
*G05F 1/67* (2006.01)

(52) U.S. Cl.
CPC ............... *H02S 40/38* (2014.12); *G05F 1/67* (2013.01); *H03K 3/037* (2013.01); *Y02E 10/56* (2013.01)

(58) Field of Classification Search
CPC ......... H02S 40/38; H02S 50/00; Y02E 10/56; G05F 1/67
See application file for complete search history.

(56) References Cited

U.S. PATENT DOCUMENTS

| | | | |
|---|---|---|---|
| 8,400,134 B2* | 3/2013 | Moussaoui | H02J 3/381 323/299 |
| 9,397,501 B2* | 7/2016 | Teo | G05F 1/67 |
| 9,991,715 B1* | 6/2018 | Huang | H02M 1/08 |
| 10,663,499 B2* | 5/2020 | Kim | G05F 1/67 |
| 11,114,860 B2* | 9/2021 | Kang | H02M 7/5395 |

FOREIGN PATENT DOCUMENTS

| | | |
|---|---|---|
| KR | 10-1598464 B1 | 3/2016 |
| KR | 10-2161812 B1 | 10/2020 |
| KR | 10-2021-0005502 A | 1/2021 |

* cited by examiner

*Primary Examiner* — Patrick O Neill
(74) *Attorney, Agent, or Firm* — NSIP Law

(57) ABSTRACT

An energy harvester is provided. The energy harvester includes a current-voltage converter, a voltage-PWM converter, an analog multiplier, a sample-hold circuit, an α-generator, and a fractional open-circuit voltage circuit.

5 Claims, 11 Drawing Sheets

ENERGY HARVESTER

CROSS-REFERENCE TO RELATED APPLICATIONS

A claim for priority under 35 U.S.C. § 119 is made to Korean Patent Application No. 10-2021-0011770 filed on Jan. 27, 2021 and Korean Patent Application No. 10-2021-0061623 filed on May 12, 2021 in the Korean Intellectual Property Office, the entire contents of which are hereby incorporated by reference.

BACKGROUND

Embodiments of the inventive concept described herein relate to a solar energy harvester system, and more particularly, to an energy harvester system that drives optimal power in a low-power environment using a battery.

Low-power Internet of Things (IoT) devices require energy harvesting technology that collects energy discarded from the surrounding environment and converts it into electrical energy to operate without external power.

In the case of solar energy harvesting, an output voltage and an output current change depending on resistance of load attached to a rear end of a solar cell, and therefore output power also changes. Therefore, in the case of solar energy harvesting technology, Maximum Power Point Tracking (MPPT) technology, which is a technology for detecting an output voltage generating maximum output power, is required.

In the solar energy harvester, a point at which the solar cell outputs the maximum power varies based on the external environment such as light intensity and temperature. Therefore, it is necessary to periodically retrace the point of maximum power output.

Algorithms used in a maximum power point tracking system of the conventional solar energy harvester include Perturb & Observe (P&O), Fractal Open Circuit Voltage (FOCV), and Neural Network.

For P&O technology, in the case of a solar cell having two or more points having maximum power, there is a possibility of finding a local MPP point rather than a global MPP point. For the conventional FOCV technology, the ratio between the maximum power output voltage and the open circuit voltage should be specified externally, but when the external environment changes, it may not be the actual maximum power output voltage. In addition, for the neural network technology, the maximum power output point is tracked based on the changing environment, but power consumption is very high during the tracking time, and thus it is not suitable in a low power environment.

Finally, in a low-power environment, the FOCV method may be the best choice. However, the solar cell may change its own characteristics depending on the external environment, and the voltage generating the maximum output power may change in real time. Therefore, there is a need for a method of periodically finding the characteristics of the solar cell in the current environment and the Maximum Power Point (MPP).

SUMMARY

Embodiments of the inventive concept provide an energy harvester that is capable of widely tracking MPP with low power.

According to an exemplary embodiment, an energy harvest include a current-voltage converter that senses a current of a solar cell in a current mirror method while charging an output of the solar cell in a capacitor, and calculates an output voltage (V) using the sensed current, a voltage-PWM converter that generates a pulse width modulation (PWM) single pulse by comparing the output voltage calculated by the current-voltage converter with a ramp voltage, an analog multiplier that determines an output power (P) of the solar cell by multiplying the output voltage (V) of the current-voltage converter by the PWM single pulse, a sample-hold circuit that measures a maximum output power in real time by comparing the output power (P) from the analog multiplier with a maximum power value, and measures a voltage ($V_{MPP}$) of the solar cell generating the maximum output power in real time, an α-generator that generates a digital bit of n-bit using the open circuit voltage of the solar cell and the $V_{MPP}$ obtained from the sample-hold circuit, and a fractional open-circuit voltage (FOCV) circuit that include a plurality of capacitors, charges and redistributes charge to the capacitors using the n-bit of the digital bit of the α-generator and the voltage of the open circuit.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
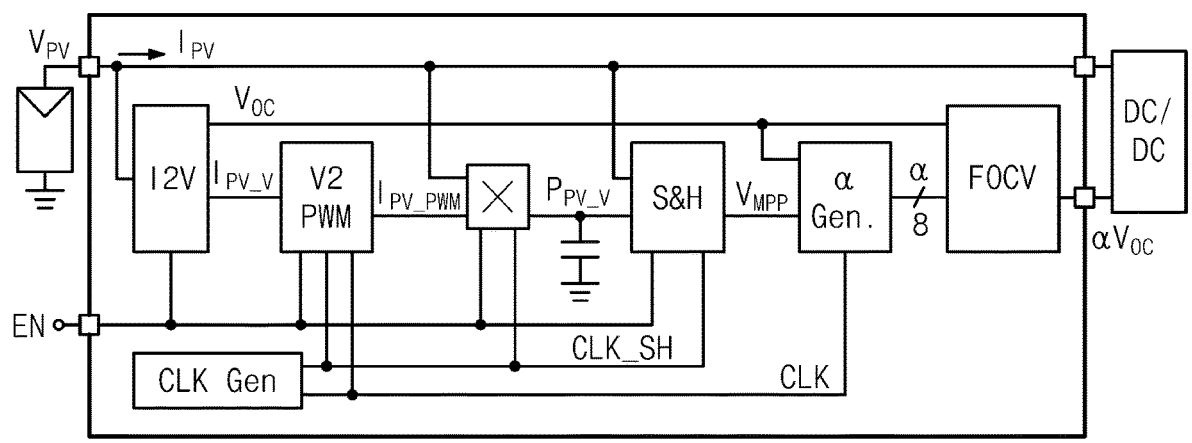
FIG. 1 is a block diagram illustrating an energy harvester according to an embodiment of the present disclosure.

Disclosed hereinafter are exemplary embodiments of the present invention. Particular structural or functional descriptions provided for the embodiments hereafter are intended merely to describe embodiments according to the concept of the present invention. The embodiments are not limited as to a particular embodiment.

Terms such as "first" and "second" may be used to describe various parts or elements, but the parts or elements should not be limited by the terms. The terms may be used to distinguish one element from another element. For instance, a first element may be designated as a second element, and vice versa, while not departing from the extent of rights according to the concepts of the present invention.

Unless otherwise clearly stated, when one element is described, for example, as being "connected" or "coupled" to another element, the elements should be construed as being directly or indirectly linked (i.e., there may be an intermediate element between the elements). Similar interpretation should apply to such relational terms as "between", "neighboring," and "adjacent to."

Terms used herein are used to describe a particular exemplary embodiment and should not be intended to limit the present invention. Unless otherwise clearly stated, a singular term denotes and includes a plurality. Terms such as "including" and "having" also should not limit the present invention to the features, numbers, steps, operations, sub-parts and elements, and combinations thereof, as described; others may exist, be added or modified. Existence and addition as to one or more of features, numbers, steps, etc. should not be precluded.

Unless otherwise clearly stated, all of the terms used herein, including scientific or technical terms, have meanings which are ordinarily understood by a person skilled in the art. Terms, which are found and defined in an ordinary dictionary, should be interpreted in accordance with their usage in the art. Unless otherwise clearly defined herein, the terms are not interpreted in an ideal or overly formal manner.

Example embodiments of the present invention are described with reference to the accompanying drawings. However, the scope of the claims is not limited to or restricted by the example embodiments. Like reference numerals proposed in the respective drawings refer to like elements.

Hereinafter, an embodiment of the inventive concept will be described in more detail with reference to the accompanying drawings. Embodiments of the inventive concept may be modified in various forms, and the scope of the inventive concept should not be construed as being limited to the following embodiments. This embodiment is provided to more completely explain the inventive concept to those of ordinary skill in the art. Accordingly, the shapes of elements in the drawings are exaggerated to emphasize a clearer description.

Hereinafter, embodiments of the present disclosure will be described in detail with reference to the accompanying drawings. However, the scope of the application is not limited or confined by these embodiments. Like reference numerals in each figure indicate like elements.

Figure 2:
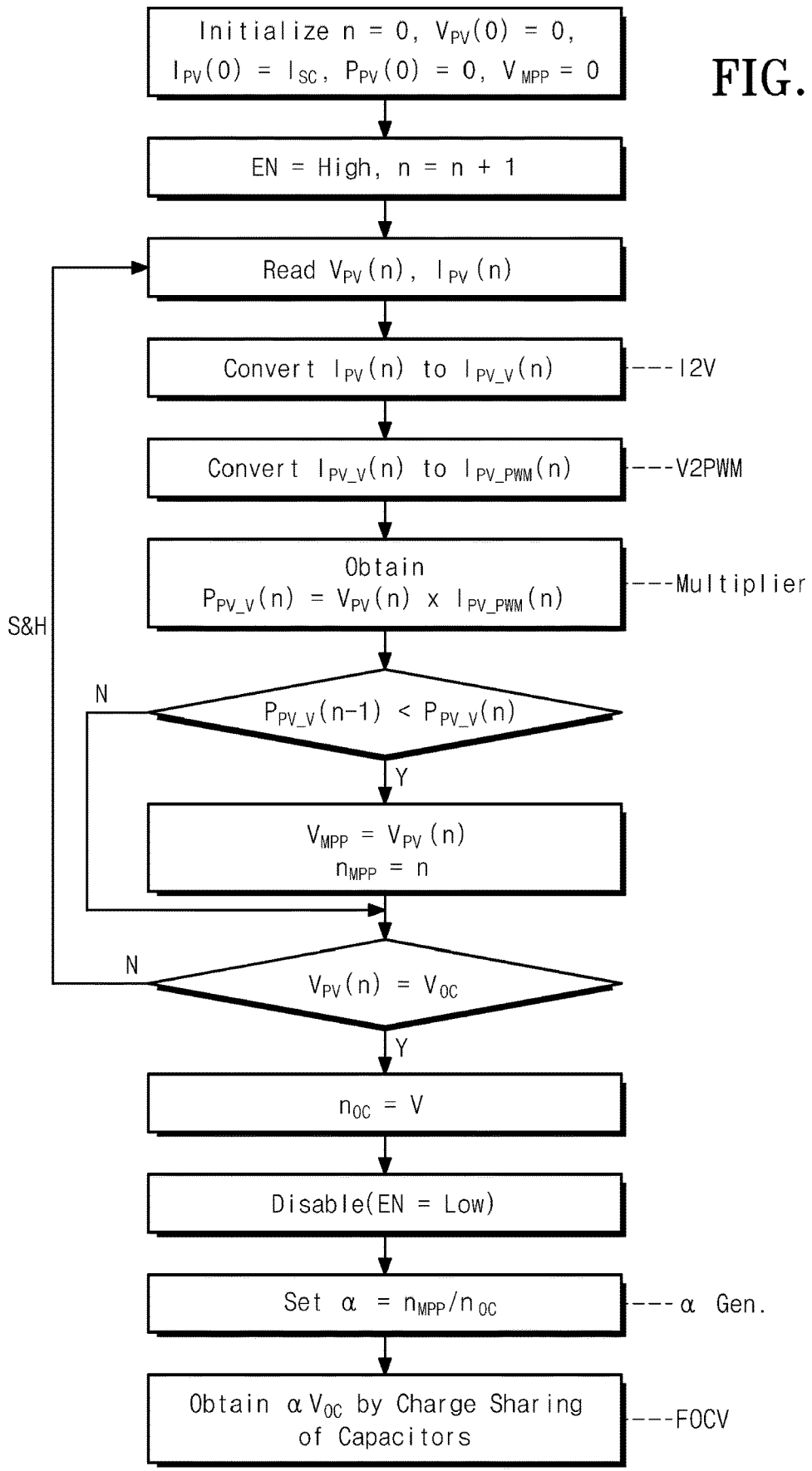
FIG. 2 is a flowchart illustrating a method of driving the energy harvest shown in FIG. 1.

FIG. 1 is a block diagram illustrating an energy harvester according to an embodiment of the present disclosure, and FIG. 2 is a flowchart illustrating a method of driving the energy harvest shown in FIG. 1.

Referring to FIGS. 1 and 2, the energy harvester (which may be referred to as an energy harvesting device, an energy harvester system, an energy harvester device, a maximum power point tracking device, etc. according to an embodiment) may include a current-to-voltage converter I2V, voltage-to-pulse width modulation PWM converter V2PWM, an analog multiplier X, a sample-hold circuit S&H, α-generator α-Gen., and a fractional open-circuit voltage circuit FOCV. The energy harvester may receive an output voltage $V_{PV}$ and/or an output current $I_{PV}$ of a solar cell and may output an output current $I_{PV}$ and/or a voltage $\alpha VOC$ at a point of maximum power.

According to an embodiment, the energy harvester may further include a clock generator CLK Gen that generates and outputs at least one clock for operation of at least one of the voltage-PWM converter, the analog multiplier, and the sample-hold circuit, and an α-generator. In addition, the energy harvester may receive a driving voltage $V_{DD}$ for driving at least some of blocks from the outside, may further include a power supply unit for supplying the driving voltage $V_{DD}$, or may be supplied from the solar cell.

At least one clock generated by the clock generator may include a first clock CLK_SH for the voltage-to-PWM converter, analog multiplier, and sample-hold circuit and a second clock CLK for the voltage-PWM converter and α-generator.

In addition, at least some of the blocks of the energy harvester, for example, the current-voltage converter, the voltage-PWM converter, the analog multiplier, and the sample-hold circuit may perform a predetermined operation in response to receiving an activation signal EN input from the outside.

Figure 3:
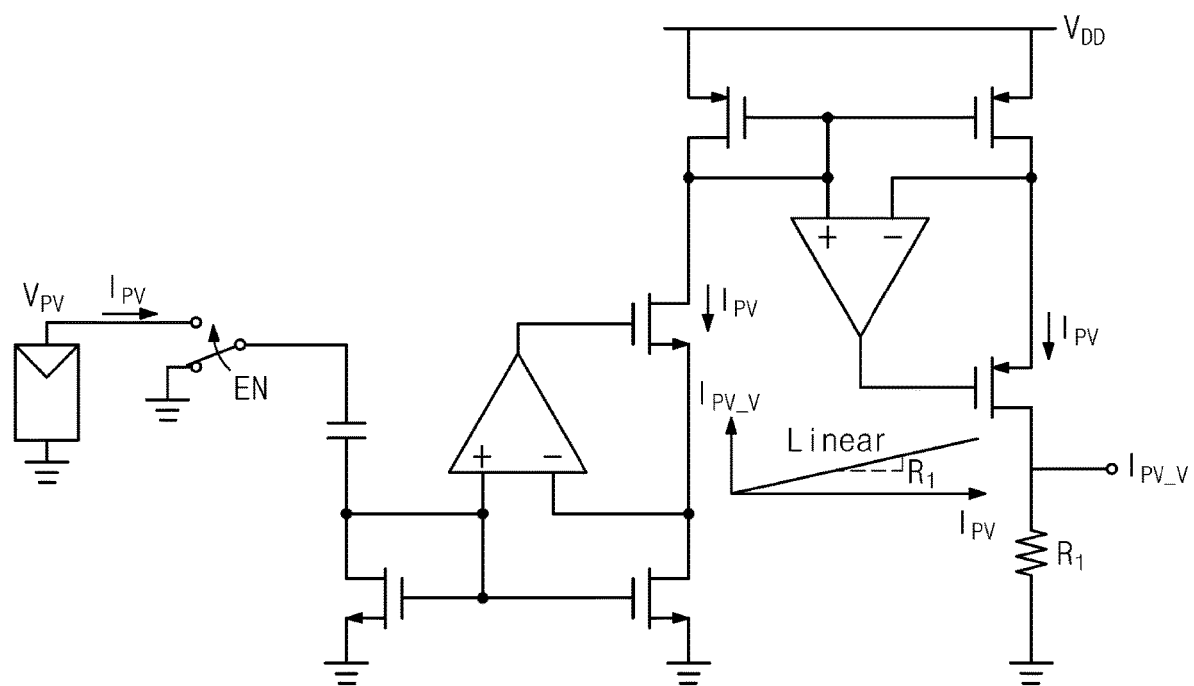
FIG. 3 is a block diagram illustrating a current-voltage converter of the energy harvester shown in FIG. 1.

FIG. 3 is a block diagram illustrating a current-voltage converter of the energy harvester shown in FIG. 1.

Referring to FIGS. 1 to 3, the current-voltage converter may detect the output voltage $V_{PV}$ of the solar cell and/or the output current $I_{PV}$ of the solar cell in a current mirror method while charging a power (voltage) of the solar cell in a capacitor. Here, the output voltage of the solar cell may have a range from 0V to an output voltage $V_{OC}$ in an open circuit of the solar cell. The output current of the solar cell may have a range from an output current $I_{SC}$ in a short circuit of the solar cell to 0 A. The output current $I_{PV}$ may be converted to a voltage $I_{PV\_V}$ by multiplying a resistor $R_1$, and the current-voltage converter may output the voltage $I_{PV\_V}$.

Figure 4:
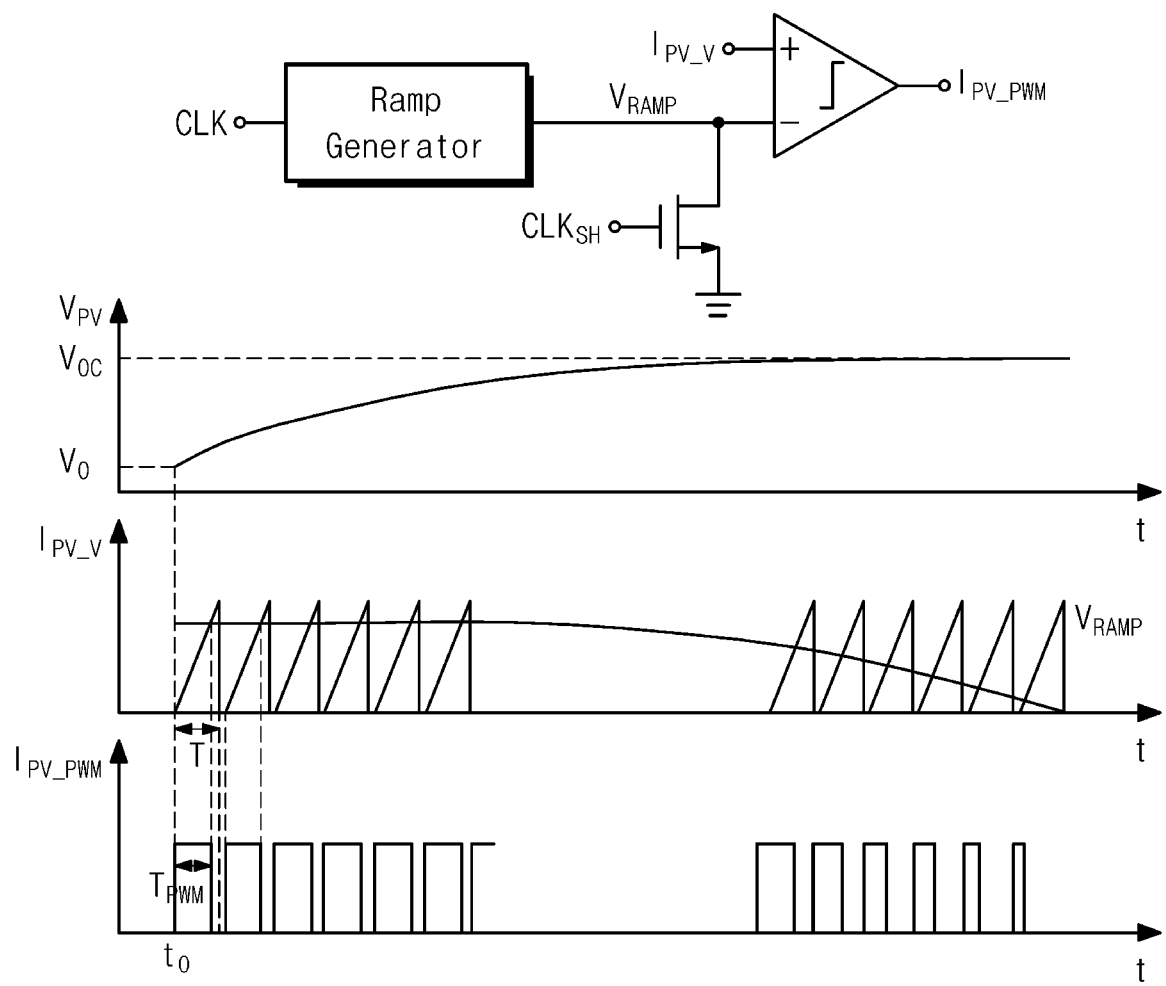
FIG. 4 is a block diagram and a timing diagram for explaining a voltage-PWM converter of the energy harvester shown in FIG. 1.

FIG. 4 is a block diagram and a timing diagram for explaining a voltage-PWM converter of the energy harvester shown in FIG. 1.

Referring to FIGS. 1, 2, and 4, the voltage-PWM converter may compare $I_{PV\_V}$ with an output voltage $V_{RAMP}$ of a ramp voltage generator to convert it into a width of a pulse.

Here, a slope of $V_{RAMP}$ is as shown in Equation 1 below.

$$\frac{\max(V_{RAMP})}{T} = \frac{I_{PV_V}(n)}{T_{PWM}(n)} \qquad \text{[Equation 1]}$$

In Equation 1, T is a period of $V_{RAMP}$, and n is an integer greater than or equal to 1.

Also, by modifying Equation 1, Equation 2 may be obtained.

$$T_{PWM}(n) = \frac{T \times I_{PV_V}(n)}{\max(V_{RAMP})} \qquad \text{[Equation 2]}$$

According to Equation 2, $I_{PV\_V}$ and a width of a single pulse are proportional. That is, as $I_{PV\_V}$ increases, the width of the single pulse becomes wider, and as $I_{PV\_V}$ decreases, the width of the single pulse becomes narrower.

Figure 5:
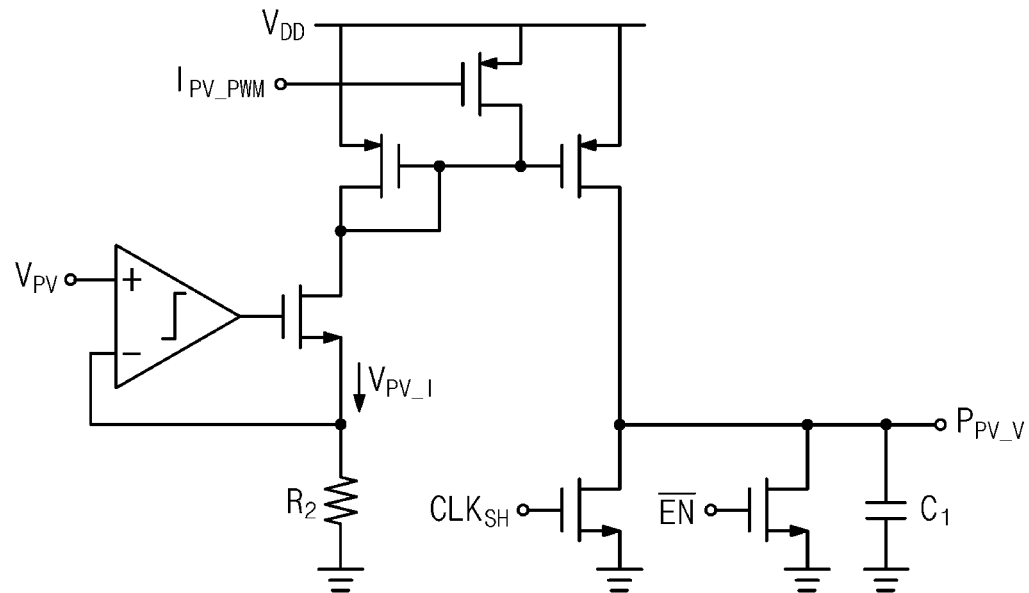
FIG. 5 is a block diagram and a timing diagram for explaining an analog multiplier of the energy harvester shown in FIG. 1.
Figure 5:
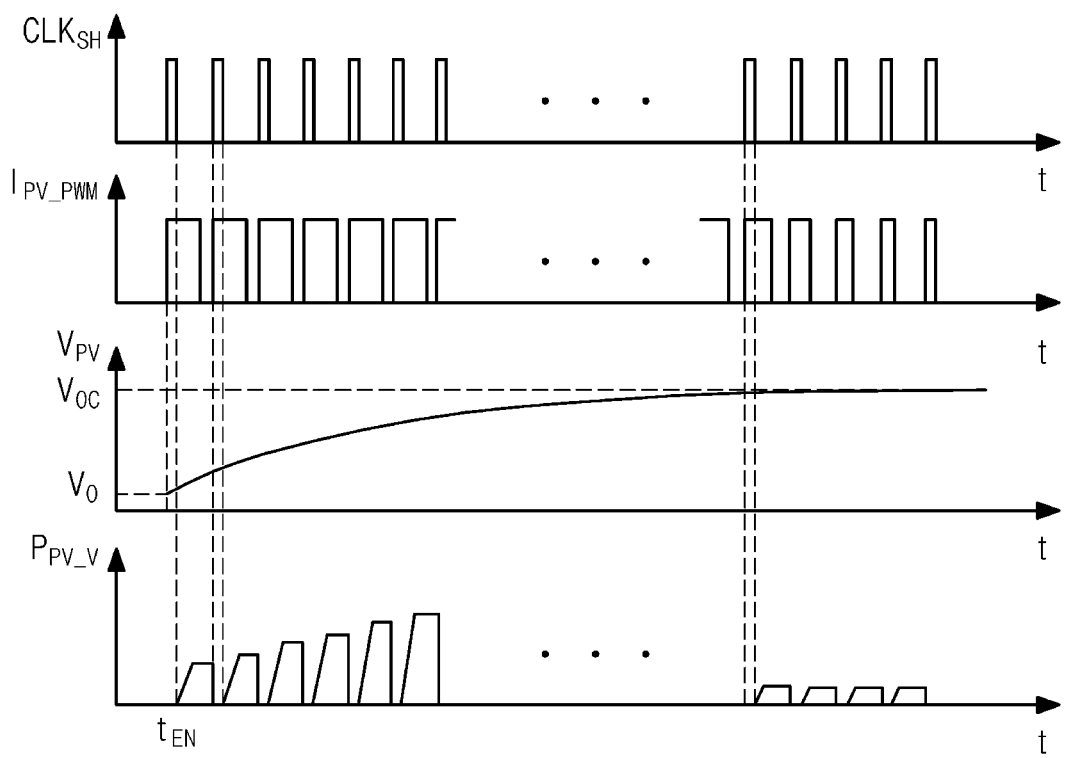

FIG. 5 is a block diagram and a $_{timing}$ diagram for explaining an analog multiplier of the energy harvester shown in FIG. 1.

Referring to FIGS. 1, 2, and 5, the analog multiplier may convert $V_{PV}$ into a current $V_{PV\_I}$ through a resistor $R_2$. That is, $V_{PV\_I} = R_2 \times V_{PV}$. As a result, the analog multiplier may determine an output power $P_{PV\_V}$ of the solar cell in a form of charging a capacitor $C_1$ by a product of the current in the solar cell implemented by the width of the pulse and $V_{PV\_I}$ of the solar cell. This is the same as Equation 3 below.

$$P_{PV_V}(n) = \frac{Q_1(n)}{C_1} = \quad\text{[Equation 3]}$$

$$\frac{V_{PV_I}(n) \times T_{PWM}(n)}{C_1} = \frac{TR_1}{C_1 R_2 \max(V_{RAMP})} V_{PV}(n) I_{PV}(n)$$

Figure 6:
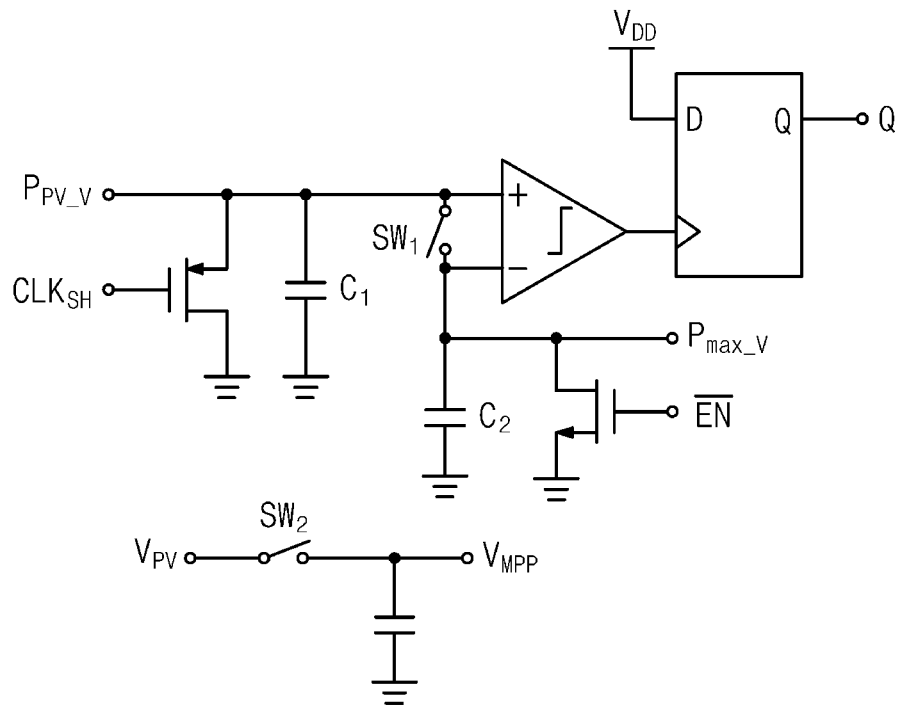
FIG. 6 is a block diagram and a timing diagram for explaining a sample-hold circuit of the energy harvester shown in FIG. 1.
Figure 6:
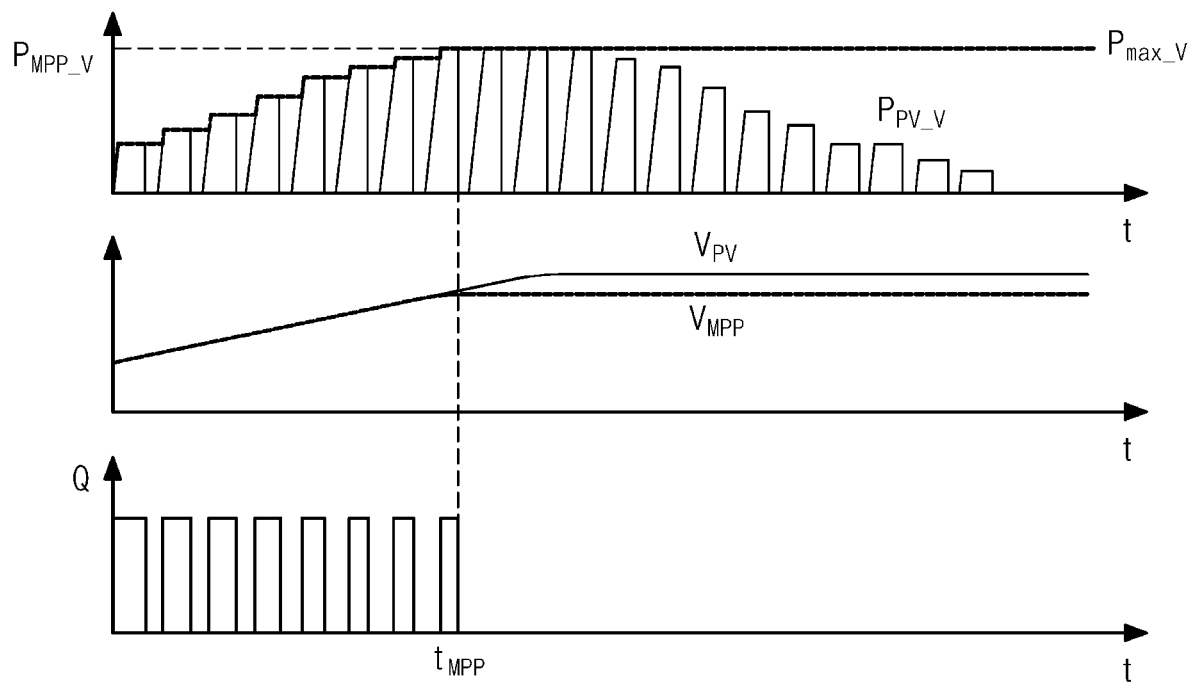

FIG. 6 is a block diagram and a timing diagram for explaining a sample-hold circuit of the energy harvester shown in FIG. 1.

Referring to FIGS. 1, 2, and 6, the sample-hold circuit may compare an output power $P_{PV\_V}(n+1)$ with a currently stored maximum power value $P_{max\_V}(n)$ to determine a maximum output power in real time, and may measure a voltage $V_{MPP}$ of the solar cell generating the maximum output power at the same timing as the timing for measuring the maximum output power in real time.

Here, when $P_{PV\_V}(n+1)$ is greater than $P_{max\_V}(n)$, $P_{max\_V}$ may be newly stored. In FIG. 6, when Q is turned on, $SW_1$ and $SW_2$ are turned on. That is, the output Q of the D flip-flop may be understood as a control signal for controlling the opening and closing of $SW_1$ and $SW_2$. For example, Q having a 'high' value may be understood as a control signal for turning on $SW_1$ and $SW_2$, and Q having a 'low' value may be understood as a control signal for turning off $SW_1$ and $SW_2$. Accordingly, $$P_{max\_V}\left(P_{maxV} = \frac{C_1}{C_1 + C_2} P_{PV}\right)$$

may be stored in $C_2$ and $V_{MPP}(n)$ may be stored in $C_3$.

Meanwhile, when $P_{PV\_V}(n+1)$ is less than or equal to $P_{max\_V}(n)$, Q is turned off, and $SW_1$ and $SW_2$ are turned off.

Referring to FIGS. 1 and 2, the α-generator may use an 8-bit successive-approximation-register (SAR) analog-to-digital converter (ADC) scheme. According to an embodiment, the α-generator may receive the open circuit voltage $V_{OC}$ of the solar cell and $V_{MPP}$, which is the output of the sample-hold circuit, as inputs, and may generate α<(k−1):0> (for example, when k is 8, α<7:0>) of k-bit (k is a natural number greater than or equal to 2, for example, k may be 8) that satisfies $$\alpha = \frac{V_{MPP}}{V_{OC}}.$$

Here, α may mean a voltage factor that is a ratio between the output $V_{MPP}$ of the sample-hold circuit and the open circuit voltage $V_{OC}$. Accordingly, the α-generator may be referred to as a voltage factor generator.

Figure 7:
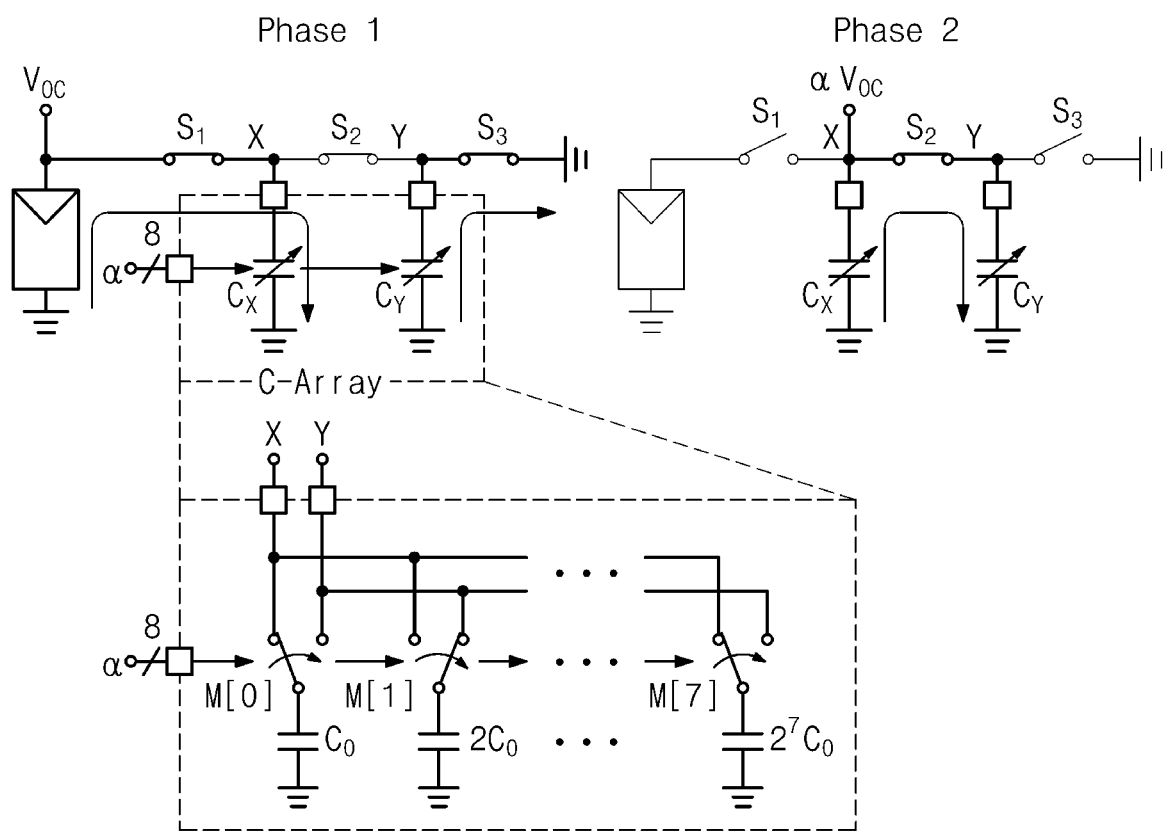
FIG. 7 is a block diagram and a timing diagram for explaining a FOCV circuit of the energy harvester shown in FIG. 1.

FIG. 7 is a block diagram and a timing diagram for explaining a FOCV circuit of the energy harvester shown in FIG. 1.

Referring to FIGS. 1, 2, and 7, the FOCV circuit may include $2^k-1$ (for example, $2^8-1$) capacitors $C_0$. Taking α<7:0> and $V_{OC}$ as inputs, the capacitors $C_0$ may be arranged to satisfy $$\alpha V_{OC} = \frac{C_X}{C_X + C_Y} V_{OC} = \frac{C_X}{(2^8-1)C_0} V_{OC}.$$

First, in the case of phase 1 (which may also be called a first phase, first phase, first mode, etc.), when switches $S_1$ and $S_3$ are closed and $S_2$ is opened, $V_{OC}$ may be charged to $C_X$. In the case of phase 2 (which may be referred to as a second phase, a second phase, a second mode, etc.), when $S_1$ and $S_3$ are opened and $S_2$ is closed, $\alpha V_{OC}$ may be generated through charge redistribution of $V_{OC}$ stored in $C_X$.

Hereinafter, a simulation result of an energy harvester according to an embodiment of the present disclosure will be described.

Figure 8:
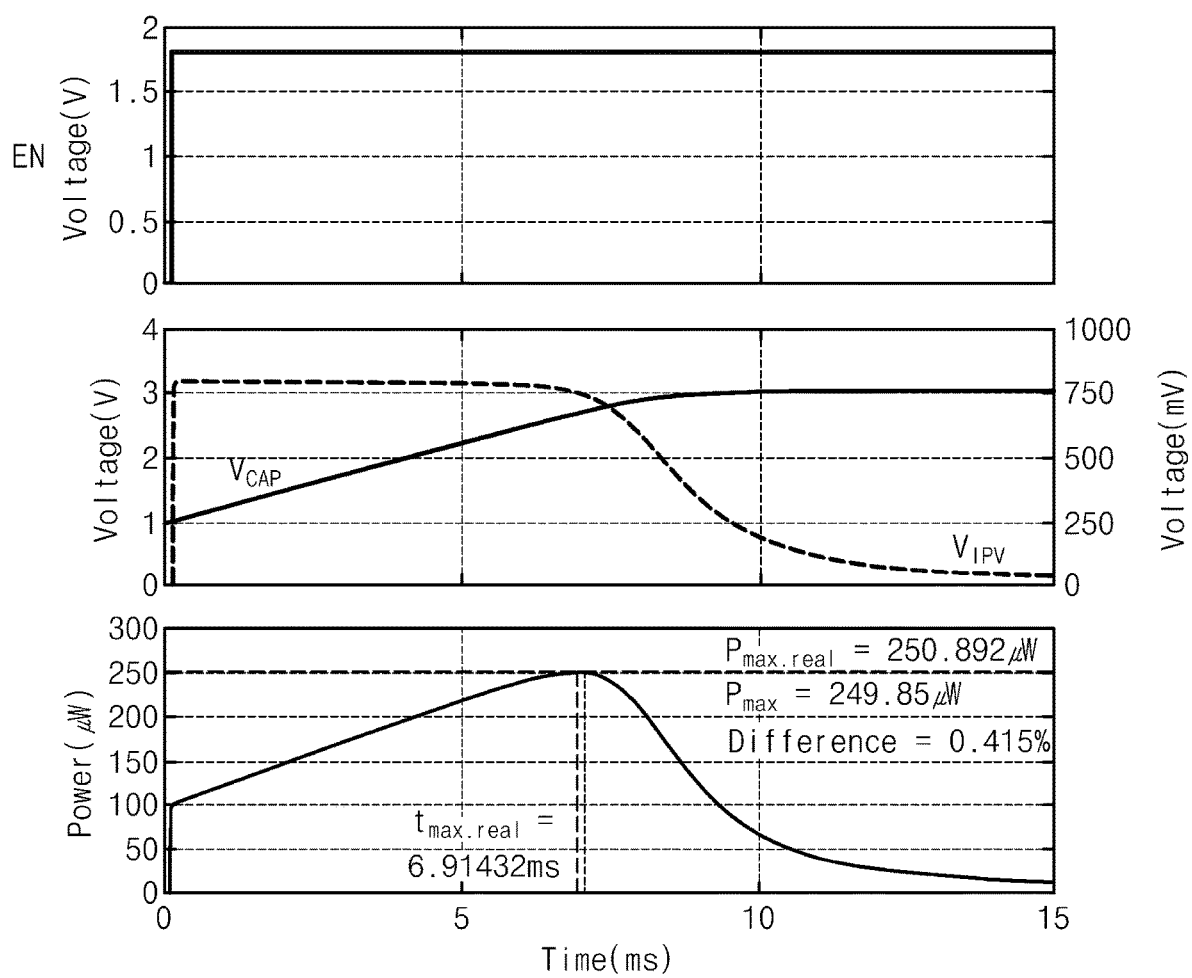
FIGS. 8 to 10 are graphs of I-V curve simulation results of a current-voltage converter of an energy harvester according to an embodiment of the present disclosure.
Figure 9:
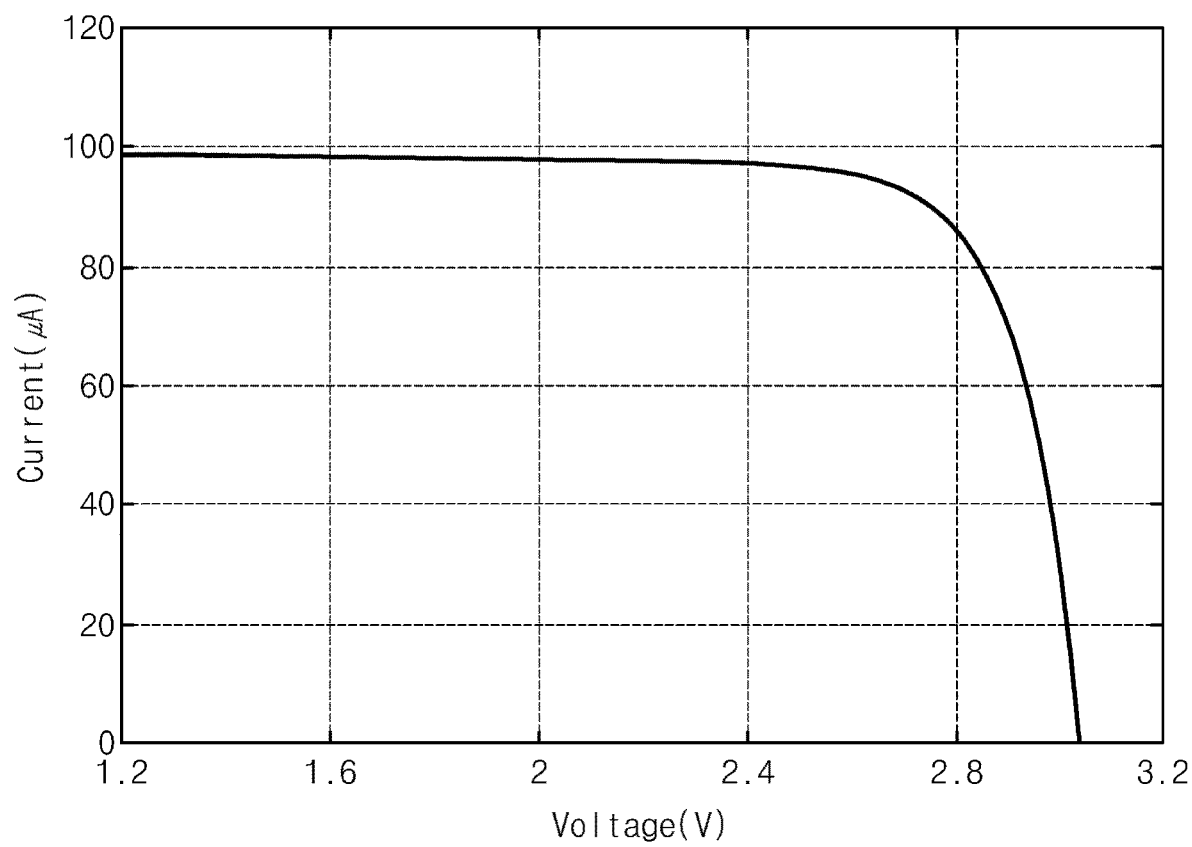
Figure 10:
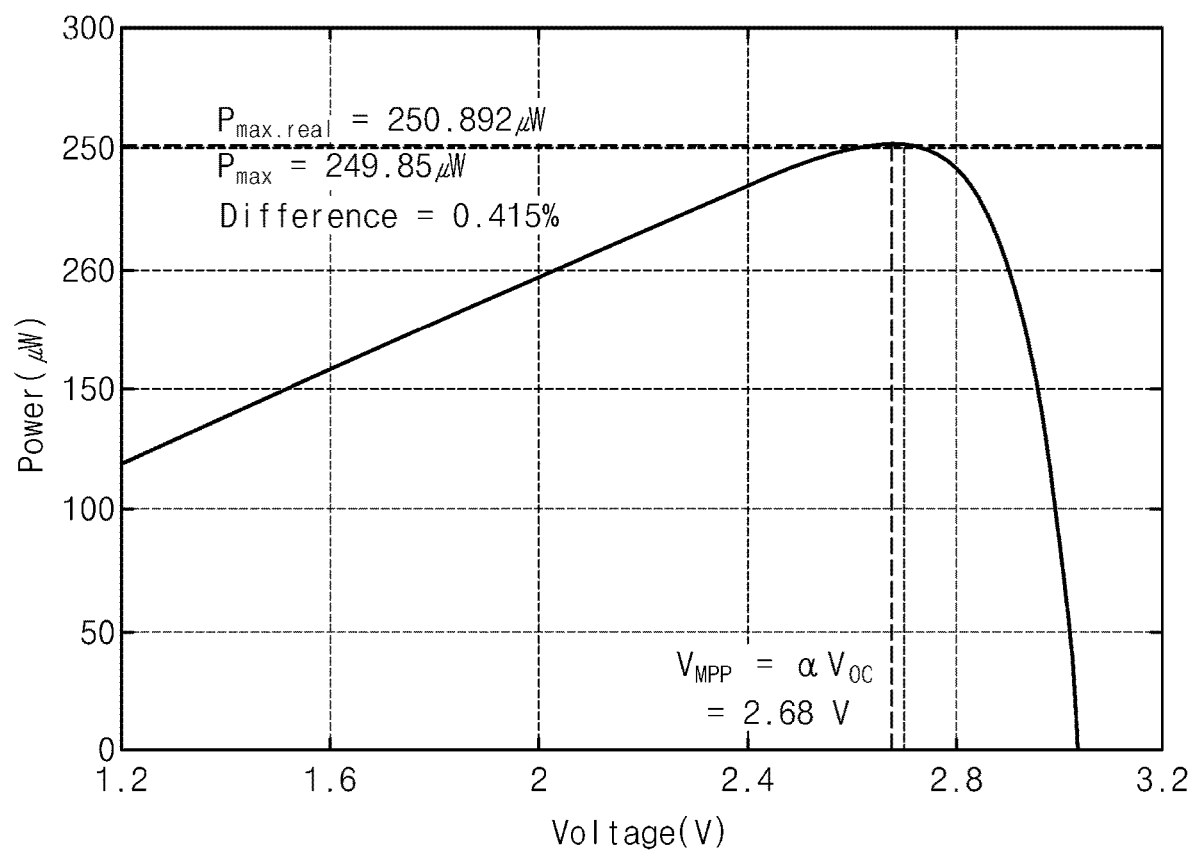

FIGS. 8 to 10 are graphs of I-V curve simulation results of a current-voltage converter of an energy harvester according to an embodiment of the present disclosure.

FIG. 8 is a transient simulation result, FIG. 9 is an IV curve simulation graph, and FIG. 10 is a voltage-power simulation graph.

In detail, FIG. 8 is a simulation for measuring whether voltage and current of a solar cell are normally swept and detected when an EN signal is applied to a current-voltage converter.

Referring to FIGS. 8 to 10, it is possible to compare an error between a maximum power of the actual solar cell and a maximum power measured when a current is converted into a voltage form after going through a current-voltage converter. The maximum power of the actual solar cell is 250.892 uW, and the calculated maximum power after going through the current-voltage converter is 249.85 uW, with a calculated error of 0.415%.

Figure 11:
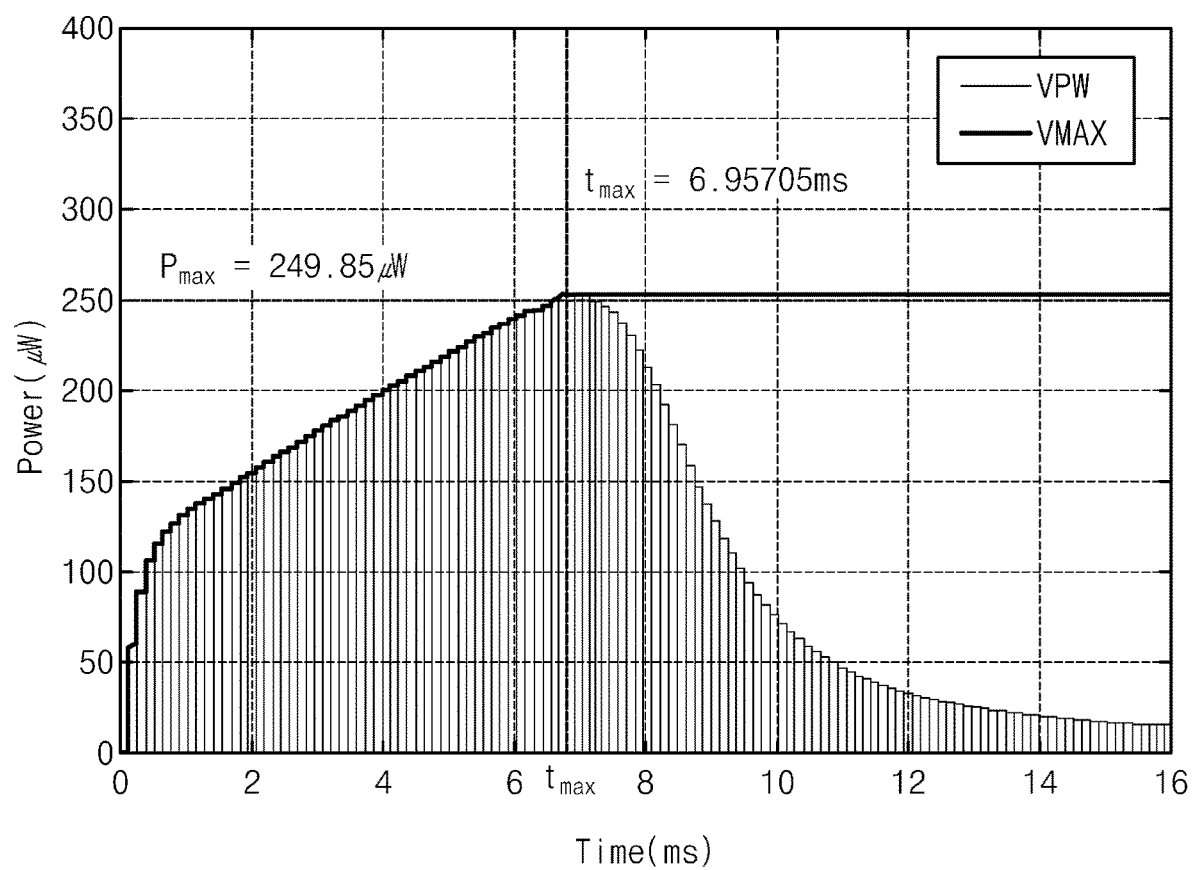
FIG. 11 is a graph illustrating a simulation result of operation transient characteristics of an analog multiplier of an energy harvester according to an embodiment of the present disclosure.

FIG. 11 is a graph illustrating a simulation result of operation transient characteristics of an analog multiplier of an energy harvester according to an embodiment of the present disclosure.

Referring to FIG. 11, it may be seen that the tracking time is 6.96 ms.

As described above, in the energy harvester according to an embodiment of the present disclosure, the global MPP points may be tracked by measuring the full range of the voltage and current that the solar cell is capable of driving, through the current-voltage converter. In addition, the total power of the solar cell may be obtained even at low power by implementing the analog power calculation circuit by converting the current of the solar cell into the voltage form and the PWM form and multiplying them.

According to embodiments of the present disclosure, the voltage and current of the full range that the solar cell is capable of driving through the current-voltage converter may be measured, thereby tracking the global MPP points. In addition, the analog power calculation circuit by converting the solar cell current into voltage form and PWM form and multiplying them may be implemented, thereby obtaining the full power of the solar cell at low power.

As mentioned above, although embodiments of the present disclosure have been described with reference to the accompanying drawings, those of ordinary skill in the art to which the present disclosure pertains may implement the present disclosure in other specific forms without changing its technical spirit or essential features. Therefore, it should be understood that the embodiments described above are illustrative in all respects and not restrictive.

What is claimed is:

1. An energy harvester comprising:
    a current-voltage converter configured to sense a current of a solar cell in a current mirror method while charging an output of the solar cell in a capacitor, and to calculate an output voltage (V) using the sensed current;
    a voltage-PWM converter configured to generate a pulse width modulation (PWM) single pulse by comparing the output voltage calculated by the current-voltage converter with a ramp voltage;

an analog multiplier configured to determine an output power (P) of the solar cell by multiplying an output voltage of the solar cell by the PWM single pulse;

a sample-hold circuit configured to measure a maximum output power in real time by comparing the output power (P) from the analog multiplier with a maximum power value, and to measure a voltage ($V_{MPP}$) of the solar cell generating the maximum output power in real time;

an α-generator configured to generate a digital bit having n-bit using an open circuit voltage of the solar cell and the $V_{MPP}$ obtained from the sample-hold circuit; and a fractional open-circuit voltage (FOCV) circuit configured to include a plurality of capacitors and to charge and redistribute charge to the capacitors using the digital bit of the a-generator and the open circuit voltage of solar cell.

2. The energy harvester of claim 1, wherein in the current-voltage converter,
the output voltage (V) is obtained by multiplying the current sensed by the solar cell by a resistance.

3. The energy harvester of claim 1, wherein in the voltage-PWM converter, when the sensed current is greater, a width of the PWM single pulse becomes wider, and when the sensed current is smaller, the width of the PWM single pulse becomes narrower.

4. The energy harvester of claim 1, wherein the sample-hold circuit includes the plurality of capacitors, and
wherein when the output power is greater than the maximum power value, the output power is stored in one of the capacitors.

5. The energy harvester of claim 1, wherein the a-generator generates 8-bit, and
wherein α<7:0> that satisfies the a value obtained by dividing the $V_{MPP}$ by the open circuit voltage is generated.

* * * * *